United States Patent
Shin

(10) Patent No.: US 6,835,917 B2
(45) Date of Patent: Dec. 28, 2004

(54) MOLDING HEATER FOR HEATING SEMICONDUCTOR WAFER AND FABRICATION METHOD THEREOF

(75) Inventor: Yong Woo Shin, Kyunggi-do (KR)

(73) Assignee: Jusung Engineering Co., Ltd., Kyunggi-do (KR)

( * ) Notice: Subject to any disclaimer, the term of this patent is extended or adjusted under 35 U.S.C. 154(b) by 37 days.

(21) Appl. No.: 10/295,901

(22) Filed: Nov. 18, 2002

(65) Prior Publication Data

US 2003/0098300 A1 May 29, 2003

(30) Foreign Application Priority Data

Nov. 23, 2001  (KR) ................................ 10-2001-0073338

(51) Int. Cl.[7] ................................................ H05B 3/68
(52) U.S. Cl. ...................................... 219/444.1; 219/544
(58) Field of Search ........................... 219/443.1, 444.1, 219/465.1, 467.1, 468.1, 468.2, 544, 546, 547, 548, 523; 118/724, 725; 29/610.1, 613, 614, 616, 617

(56) References Cited

U.S. PATENT DOCUMENTS

| | | | | |
|---|---|---|---|---|
| 2,152,126 A | * | 3/1939 | Young | .................... 219/465.1 |
| 4,304,544 A | * | 12/1981 | Crandell | ..................... 425/549 |
| 5,198,641 A | * | 3/1993 | Nagano et al. | ............. 219/544 |
| 5,796,074 A | | 8/1998 | Edelstein et al. | |
| 6,180,931 B1 | * | 1/2001 | Futakuchiya et al. | ....... 219/544 |
| 6,204,486 B1 | * | 3/2001 | Masaki et al. | ........... 219/444.1 |
| 6,207,932 B1 | | 3/2001 | Yoo | |

* cited by examiner

Primary Examiner—Sang Y. Paik
(74) Attorney, Agent, or Firm—Oliff & Berridge, PLC

(57) ABSTRACT

A molding heater includes a first metal plate having a recess formed on one side and a flat surface formed at the other side. A groove is formed at a lower portion of the recess and a wafer is placed on the flat surface. A hot wire is inserted into the groove. A ceramic is filled in a gap between the hot wire and the groove. A second metal plate coupled with the first metal plate fills the recess while contacting with the lower portion and lateral sides of the recess. Since the hot wire is surrounded only with a single layer of the ceramic, a resistance of the heat conduction can be minimized. Accordingly, a sufficient calorific power can be obtained through the metal plates using even a small power and a short of the hot wire due to an overload can be prevented.

9 Claims, 2 Drawing Sheets blazing or welding

MOLDING HEATER FOR HEATING SEMICONDUCTOR WAFER AND FABRICATION METHOD THEREOF

BACKGROUND OF THE INVENTION

1. Field of the Invention

The present invention relates to a molding heater and a fabrication method thereof, and more particularly, to a molding heater for heating a semiconductor wafer and a fabrication method thereof.

2. Description of the Related Art

In processes of manufacturing a semiconductor device, such as chemical vapor deposition (CVD), sputtering, plasma etching and the like, heating of the semiconductor wafer is essential. The heating of the semiconductor wafer can be implemented by mounting a hot wire within a supporting plate on which the semiconductor wafer is placed.

FIGS. 1 and 2 are schematic views of a conventional heater. Referring to FIGS. 1 and 2, the conventional heater includes a first metal plate 10a, a second metal plate 10b and a heater wire 20. The heater wire 20 also includes a hot wire 20a, an insulator (MgO) 20b surrounding the hot wire 20a, and a metal tube 20c surrounding the insulator (MgO) 20b. The heater wire 20 is mounted within a groove that is elongatedly formed on a contact surface of the metal plates 10a and 10b. A filler 30 is interposed between the heater wire 20 and the metal plates 10a and 10b in order to increase an adhesion efficiency.

If the hot wire 20a is directly contacted with the metal plates 10a and 10b, the hot wire 20a becomes electrically shorted to the metal plates 10a and 10b. Therefore, in order to prevent this phenomenon, the hot wire 20a is disposed on the middle of an inner space of the metal tube 20c and a space between the metal tube 20c and the hot wire 20a is filled with the insulator (MgO) 20b. Since the insulator (MgO) 20b is in a powdered form, if there is not the metal tube 20c, the insulator (MgO) 20b is fragile. The first metal plate 10a and the second metal plate 10b are joined together using a welding process or a blazing process.

In the above-described conventional heater, since the hot wire 20a is surrounded with a dual layer consisting of the insulator (MgO) 20b and the metal tube 20c, a large amount of power is consumed to transfer a heat generated at the hot wire 20a to the metal plates 10a and 10b. Accordingly, the hot wire 20a is easy to break due to an overheat of the hot wire 20a. Heat conduction is hindered at both the insulator (MgO) 20b itself and the contact surface between the metal tube 20c and the metal plates 10a and 10b.

The insulator (MgO) 20b contains moisture while being filled. To this end, in case where the heat is generated at the hot wire 20a, a corresponding portion is expanded, so that a burst of the metal tube 20c may occur. Therefore, in order to discharge the moisture and gas generated inside the metal tube 20c to an outside of the metal tube 20c, it is necessary to perform an outgassing process for a long time.

If the blazing process is used as a coupling method of the metal plates 10a and 10b, a contamination may be caused during the process due to a reaction of material used in the blazing process, and the blazing material may be etched during an in-situ cleaning process. Further, in case of the welding process, since a welding surface is formed on lateral sides of the metal plates 10a and 10b, a deformation may be caused due to a heat stress of the metal plates 10a and 10b when a temperature rises or falls.

SUMMARY OF THE INVENTION

Therefore, the present invention has been devised to solve the above problems, and it is an object of the present invention to provide a molding heater capable of minimizing a heat resistance layer that disturbs a heat conduction, thereby improving a generation of heat, preventing a short of a hot wire caused by an overload, in which it is unnecessary to perform an outgassing process.

It is another object of the invention to provide a fabrication method of a molding heater.

To achieve the aforementioned object of the present invention, there is provided a molding heater comprising: a first metal plate having a recess formed at one side and a flat surface formed at the other side, wherein a groove is formed at a lower portion of the recess and a wafer is placed on the flat surface formed on one side thereof and a groove elongatedly formed on a lower portion of the recess; a hot wire inserted into the groove; a ceramic filled in a gap between the hot wire and the groove; and a second metal plate coupled with the first metal plate, the second metal plate filling the recess while closely contacting with the lower portion and lateral sides of the recess.

To achieve the another object of the invention, there is provided a method for fabricating a molding heater, comprising the steps of: a) providing a first metal plate having a recess formed at one side and a flat surface formed at the other side, wherein a groove is formed at a lower portion of the recess and a wafer is placed on the flat surface; b) inserting a hot wire into the groove; c) filling a gap between the hot wire and the groove with a ceramic; and d) coupling a second metal plate with the first metal plate, the second metal plate filling the recess while the second metal plate closely contacts with the lower portion and lateral sides of the recess.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Now, preferred embodiments of the present invention will be described in detail with reference to the annexed drawings.

Figure 1:
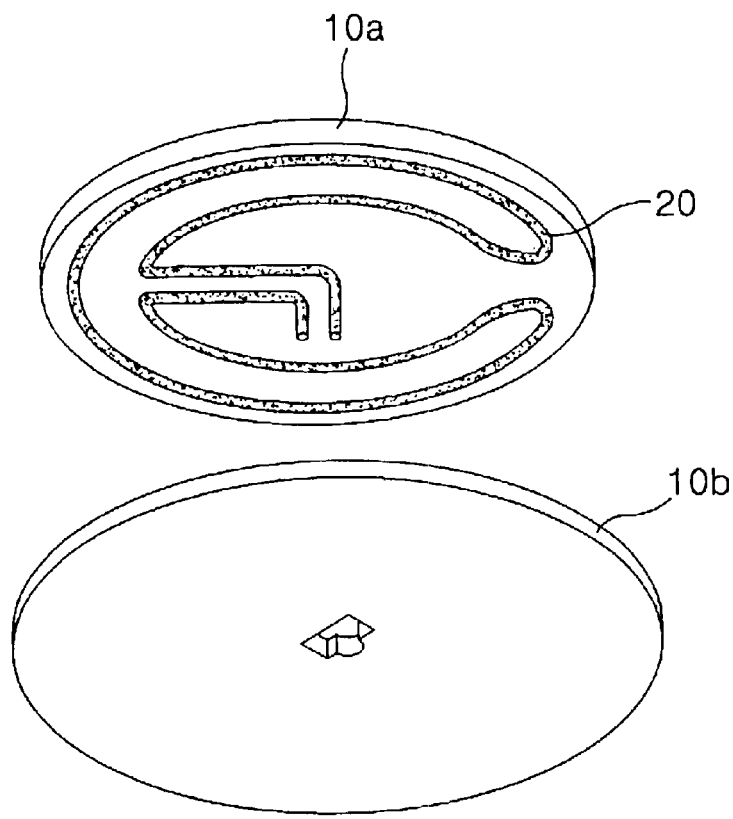
FIGS. 1 and 2 are schematic views of a conventional heater.
Figure 2:
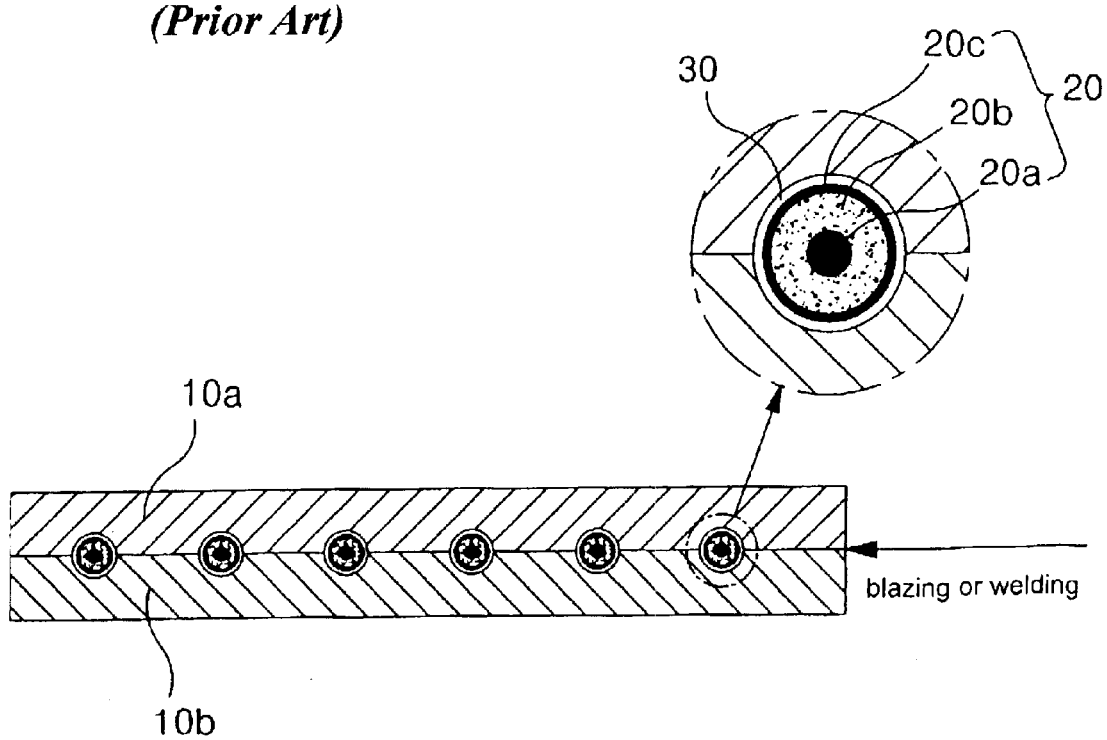
Figure 3:
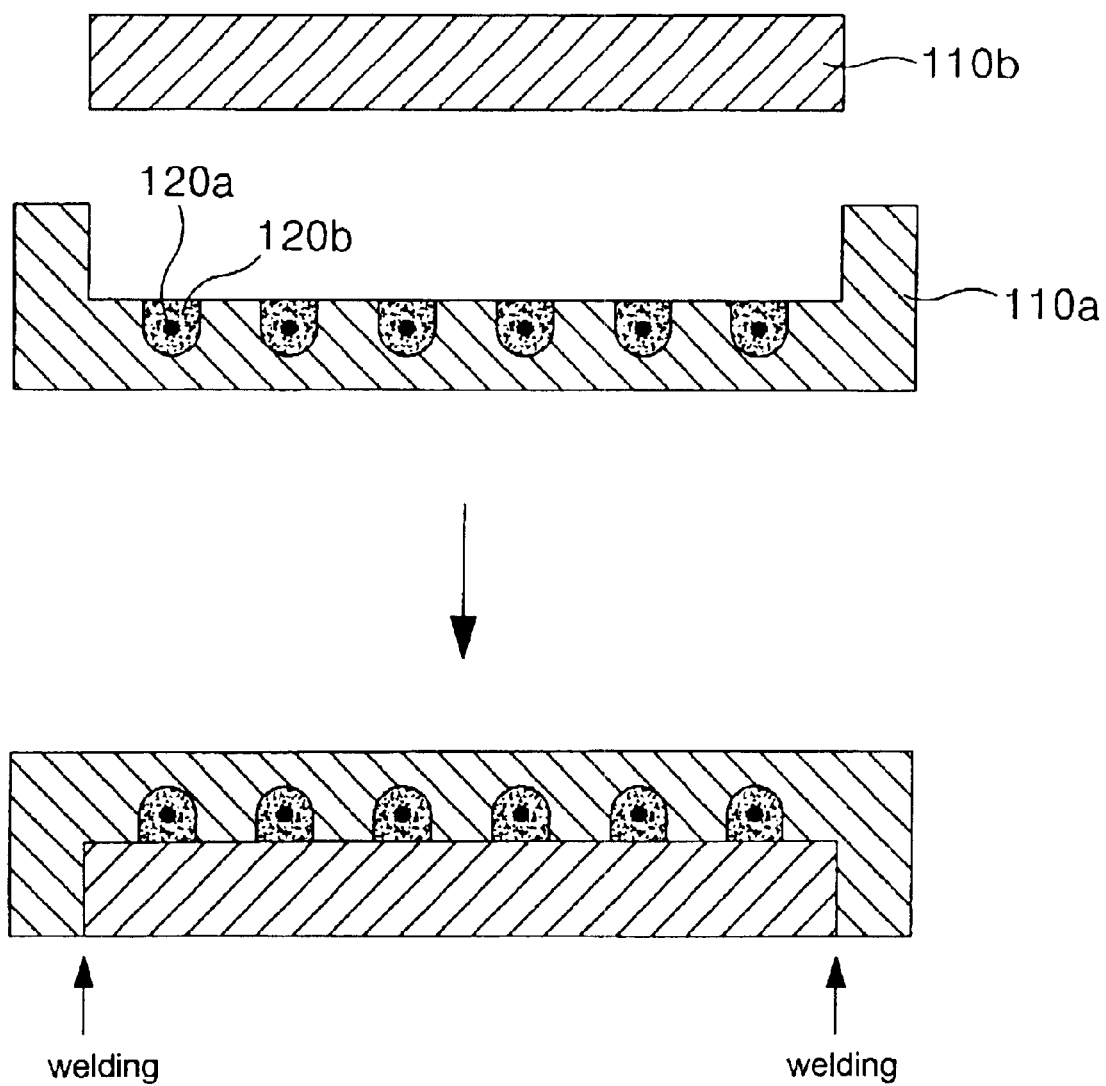
FIG. 3 is a view showing a molding heater and a fabrication method thereof in accordance with an embodiment of the present invention.

FIG. 3 is a view explaining a molding heater and a fabrication method thereof in accordance with an embodiment of the present invention. Referring to FIG. 3, a first metal plate 110a having a recess on one side thereof is provided, and a groove is elongatedly formed on a lower portion of the recess. A hot wire 120a, e.g., a Kanthal wire, is inserted into the groove. Then, a gap between the hot wire 120a and the groove is filled with a ceramic 120b. In the filling process, an $Al_2O_3$ powder and a binder solution are mixed and poured into the groove. Thereafter, a current is passed through the hot wire 120a to thereby generate resistance heat, and the binder is evaporated due to the resistance heat.

Next, a welding process is performed to couple a second metal plate 110b with the first metal plate 110a. The recess is filled while the second metal plate 110b closely contacts with both the lower portion and the lateral sides of the recess. At this time, the welding process is mainly performed at an entrance of the recess. Preferably, it is desirable that a process of oxidizing an outer surface of the metal plates 110a and 110b should be further performed after the welding process.

Since a surface oxide layer acts as a passivation film, it can prevent the surface of the metal plates 110a and 110b from being degenerated even when it is used for a long time in the CVD apparatus, etc.

In case the metal plates 110a and 110b are formed of INCONEL alloy, it is desirable that the oxidation process should be performed by heating the metal plates 110a and 110b at a temperature range of 550–800° C. in an oxygen atmosphere. Generally, the INCONEL alloy is an alloy in which chromium (Cr) or iron (Fe) is added to nickel (Ni).

In use of the molding heater in accordance with the present invention, the first metal plate 110a is placed above the second metal plate 110b. Accordingly, the wafer is placed on the other surface of the first metal plate 110a which the recess is not formed. In this manner, since the welded portion is placed oppositely to the semiconductor wafer, it can prevent the semiconductor wafer from being ununiformly heated due to an ununiform heat transfer.

As describe above, in accordance with the present invention, since the hot wire 120a is surrounded only with a single layer of the ceramic 120b, a resistance against the heat conduction can be minimized. Accordingly, a sufficient calorific power can be obtained through the metal plates 110a and 110b using even a small power. Also, breaking of the hot wire 120a due to an overload can be prevented.

Further, in accordance with the present invention, since the metal tube 20c of the conventional art is not used, it is unnecessary to perform the outgassing process, thereby simplifying a manufacturing process. Furthermore, in case the outer surfaces of the metal plates 110a and 110b are oxidized, corrosion resistance against chemical gas is increased, thereby being capable of using the metal plates for a long time in the CVD apparatus.

Furthermore, unlike the conventional art that the welding process or the blazing process is performed at the lateral sides, the second metal plate 110b is inserted into the recess of the first metal plate 110a and welded at the entrance of the recess, so that the present invention can prevent the metal plates 110a and 110b from being taken off due to a heat stress.

While the present invention has been described in detail, it should be understood that various changes, substitutions and alterations could be made hereto without departing from the spirit and scope of the invention as defined by the appended claims.

What is claimed is:

1. A molding heater; comprising:
    a first metal plate having a recess formed at one side and a flat surface formed at an other side, wherein a groove is formed at a lower portion of the recess and a wafer is placed on the flat surface;
    a hot wire inserted into the groove;
    a ceramic filled in a gap between the hot wire and the groove; and
    a second metal plate coupled with the first metal plate, the second metal plate filling the recess while contacting with the lower portion and lateral sides of the recess.

2. The molding heater of claim 1, wherein the ceramic is formed of $Al_2O_3$.

3. The molding heater of claim 1, wherein the first metal plate and the second metal plate have an outer surface which is oxidized.

4. The molding heater of claim 1, wherein the first metal plate and the second metal plate are formed of an Inconel alloy.

5. A method for fabricating a molding heater, the method comprising:
    a) providing a first metal plate having a recess formed at one side and a flat surface formed at an other side, wherein a groove is formed at a lower portion of the recess and a wafer is placed on the flat surface;
    b) inserting a hot wire into the groove;
    c) filling a gap between the hot wire and the groove with a ceramic; and
    d) coupling a second metal plate with the first metal plate, the second metal plate filling the recess while the second metal plate contacts with the lower portion and lateral sides of the recess.

6. The method of claim 5, further comprising e) oxidizing outer surfaces of the first metal plate and the second metal plate.

7. The method of claim 6, wherein the first metal plate and the second metal plate are formed of an INCONEL alloy, and e) is performed by heating the first metal plate and the second metal plate at a temperature of 550 to 800° C.

8. The method of claim 5, wherein c) is includes:
    mixing an $Al_2O_3$ powder and a binder to form a mixed solution of the $Al_2O_3$ powder and the binder;
    pouring the mixed solution into the groove; and
    passing a current through the hot wire to generate resistance heat and evaporate the binder by the resistance heat.

9. The method of claim 5, wherein d) is performed by welding the second metal plate at an entrance of the recess.

* * * * *